United States Patent

Zook et al.

Patent Number: 5,974,580
Date of Patent: Oct. 26, 1999

[54] CONCURRENT ROW/COLUMN SYNDROME GENERATOR FOR A PRODUCT CODE

[75] Inventors: Christopher P. Zook, Longmont, Colo.; Keisuke Kato, Yamato, Japan; Frederick Siu-Huang Au; Tony Jihyun Yoon, both of San Jose, Calif.

[73] Assignee: Cirrus Logic, Inc., Fremont, Calif.

[21] Appl. No.: 08/898,774

[22] Filed: Jul. 23, 1997

[51] Int. Cl.$^6$ .................................................. H03M 13/00
[52] U.S. Cl. ........................ 714/755; 714/756; 714/785
[58] Field of Search ................................. 714/781, 774, 714/807, 769, 710, 784, 785, 755, 756

[56] References Cited

U.S. PATENT DOCUMENTS

| | | | |
|---|---|---|---|
| 4,802,173 | 1/1989 | Baggen | 371/40 |
| 5,408,477 | 4/1995 | Okada et al. | 714/762 |
| 5,412,667 | 5/1995 | Havemose | 714/755 |
| 5,446,743 | 8/1995 | Zook | 714/756 |
| 5,563,897 | 10/1996 | Pyndiah et al. | 714/785 |
| 5,592,498 | 1/1997 | Zook | 714/766 |
| 5,602,857 | 2/1997 | Zook et al. | 714/765 |
| 5,631,914 | 5/1997 | Kashida et al. | 371/37.4 |
| 5,687,182 | 11/1997 | Shikakura | 714/774 |
| 5,802,080 | 9/1998 | Westby | 714/807 |
| 5,844,911 | 12/1998 | Schadegg et al. | 714/710 |
| 5,844,920 | 12/1998 | Zook et al. | 714/769 |

FOREIGN PATENT DOCUMENTS

| | | | |
|---|---|---|---|
| 0821493 | 1/1998 | European Pat. Off. | H03M 13/00 |
| WO 97/23828 | 7/1997 | WIPO | G06F 12/02 |

OTHER PUBLICATIONS

U.S. application No. 08/842,146 Zook, filed Apr. 23, 1997.
Decoding Organisation for Product Codes; No. 342; Oct. 1, 1992; p. 760.

Primary Examiner—Phung M. Chung
Assistant Examiner—Shelly A. Chase
Attorney, Agent, or Firm—Howard H. Sheerin; Dan A. Shifrin

[57] ABSTRACT

An efficient error correction processor is disclosed for correcting a multi-dimensional code comprising a first set of codewords that intersect with a second set of codewords. The error correction is carried out by performing iterative passes over the first and second set of codewords. The individual codewords are corrected using error syndromes which are computed as a function of the codeword data. In the preferred embodiment, the individual codewords are encoded according to a Reed-Solomon code and the error syndromes are computed as the modulo division of the codeword polynomial by the factors of a generator polynomial. To increase the throughput of the error correction processor, a syndrome buffer is employed to facilitate generating the error syndromes for both the first and second set codewords concurrently. In this manner, after a pass over the first set of codewords, the error syndromes for the second set codewords are available for immediate processing. In one embodiment, the syndrome buffer stores the error syndromes for both the first and second set codewords so that only one pass over the codewords is necessary to generate the error syndromes. In subsequent passes, the error syndromes are available immediately; they are not regenerated as in the prior art.

30 Claims, 12 Drawing Sheets

CONCURRENT ROW/COLUMN SYNDROME GENERATOR FOR A PRODUCT CODE

CROSS REFERENCE TO RELATED APPLICATIONS AND PATENTS

This application is related to other co-pending U.S. patent applications, namely application Ser. No. 08/842,147 entitled "A METHOD AND APPARATUS FOR EFFICIENTLY PROCESSING A MULTI-DIMENSIONAL CODE," Ser. No. 08/842,146 entitled "ERROR CORRECTION AND CONCURRENT VERIFICATION OF A PRODUCT CODE." This application is also related to U.S. Pat. No. 5,446,743 entitled "COEFFICIENT UPDATING METHOD AND APPARATUS FOR REED-SOLOMON DECODER." All of the above-named patent applications and patents are assigned to the same entity, and all are incorporated herein by reference.

FIELD OF INVENTION

The present invention relates to error correcting systems for computer storage devices, particularly to an expedient method and apparatus for generating the syndromes for the codewords of a multi-dimensional code.

BACKGROUND OF THE INVENTION

In storage devices for computer systems, a digital stream of data modulates the operation of a write transducer (e.g., the current in a coil or intensity of a laser beam) in order to write a series of transitions onto the surface of a rotating magnetic or optical disk in the form of concentric or spiral data tracks. Reading the recorded data entails positioning a read transducer over a data track, sensing the surface transitions, and demodulating the resulting analog read signal into an estimated data sequence representing the originally recorded data.

This process of recording and reading data to and from a disk storage medium is similar to a communication channel where digital data is transmitted through a noisy communication medium such as a cable or the atmosphere. In both communication and recording systems, the goal is to receive/read the transmitted/recorded data reliably and efficiently. Reliability is a measure of how accurate the data is received or, alternatively, the bit error rate in the estimated data sequence detected from the channel signal after having been corrupted by noise inherent in the recording/communication process. Efficiency is a measure of the source data rate; that is, how fast the source data can be transmitted through the communication medium and still maintain a specified bit error rate. In computer storage systems, efficiency is a measure of the linear data density in a given track and the number of concentric tracks per inch (tpi).

In what is known as the "noisy channel coding theorem", Shannon showed that the reliability and efficiency parameters of a communication system are related: the basic limitation that noise causes in a communication channel is not on the reliability of the communication, but on the speed of communication. The maximum rate that data can be transmitted over a discrete-memoryless channel and still make the error probability approach zero is called the channel capacity which is ultimately a function of the channel bandwidth and the signal-to-noise ratio or SNR.

A well known method for increasing the SNR in a communication system, and therefore increase the reliability and efficiency of the system, is to encode the source data according to an error correction code (ECC). Error correction codes increase the effective SNR by increasing the system's immunity to noise. Block error correcting codes are commonly employed in disk storage systems, particularly the Reed-Solomon block code due to its excellent error correction properties and low implementation cost and complexity.

Block codes encode a k-symbol input block of the source data stream into an n-symbol output block or codeword where n-k is the number of redundancy symbols and k/n is referred to as the code rate. The codewords are then transmitted through (stored to) the communication medium and decoded by the receiver. The encoding process performs a mathematical operation over the input block such that the output codewords are different from one another by a parameter referred to as the minimum distance of the code $d_{min}$. The minimum distance $d_{min}$ between codewords determines the amount of noise that the system can tolerate before a received codeword is decoded erroneously.

With Reed-Solomon codes, each symbol of the data stream is typically selected from a finite field $GF(2^w)$ where w is the number of binary data bits in a symbol. Each symbol of the k-symbol input block represents the coefficients of a data polynomial $D(x)$. The redundancy symbols (which are also represented as a polynomial $W(x)$) are then computed as the modulo division of the input data polynomial $D(x)$ by a generator polynomial $G(x)$:

$$W(x)=(x^m \cdot D(x)) \, MOD \, G(x)$$

where m is the degree of the generator polynomial which equals the number of redundancy symbols. The redundancy polynomial $W(x)$ is then added to the data polynomial $D(x)$ to generate a codeword polynomial $C(x)$:

ti $C(x)=(x^m \cdot D(x))+W(x)$.

The encoder circuitry for performing the above operations can be implemented simply as a linear feedback shift register (LFSR).

After encoding, the codeword $C(x)$ is transmitted through the noisy communication channel, wherein the received codeword $C'(x)$ equals the transmitted codeword $C(x)$ plus an error polynomial $E(x)$. The received codeword $C'(x)$ is corrected according to the following steps: (1) compute error syndromes $S_i$; (2) compute the coefficients of an error locator polynomial using the error syndromes $S_i$; (3) compute the roots of the error locator polynomial, the logs of the roots are the error locations $L_i$; (4) compute the error values using the error syndromes $S_i$ and the roots of the error locator polynomial.

The error syndromes $S_i$ are computed as the modulo division of the received codeword polynomial $C'(x)$ by the factors of the generator polynomial $G(x)$:

$$S_i = C'(x) \, MOD \, (x+\alpha^i)$$

when $$G(x) = \prod_{i=0}^{m-1} (x + \alpha^i)$$

where $\alpha$ is a primitive element of the finite field $GF(2^w)$. Techniques for performing the other steps of the decoding process, computing the error locator polynomial, computing the roots of the error locator polynomial, and computing the error values, are well known by those skilled in the art and are not necessary to understand the present invention. See, for example, the above referenced U.S. Pat. No. 5,446,743 entitled "COEFFICIENT UPDATING METHOD AND APPARATUS FOR REED-SOLOMON DECODER."

Another technique known in the prior art to further increase the error tolerance of the system is to arrange the codewords into what is known as a multi-dimensional or product code. Optical disk storage systems, for example, commonly employ a two-dimensional product code as shown in FIG. 2. The codewords are arranged into intersecting horizontal (or row) and vertical (or column) codewords and the decoding process is carried out in iterative passes. First a pass over the horizontal codewords is performed to correct as many errors as possible; any uncorrectable horizontal codewords are left unmodified. Then a pass is made over the vertical codewords to correct as many errors as possible, where a symbol corrected in a vertical codeword also corrects the corresponding symbol for the intersecting horizontal codeword. Consequently, the horizontal codeword may be correctable during the next horizontal pass. Similarly, a symbol corrected during a horizontal pass may render a previously uncorrectable vertical codeword correctable during the next vertical pass. This iterative process continues until the entire product code is corrected, or deemed uncorrectable.

Although the multi-dimensional aspect of a product code significantly increases the error tolerance, the iterative passes over the horizontal and vertical codewords requires a significant amount of compute time. In an optical disk storage device, this compute time translates into latency in reading data from the disk and may also prevent transferring the data on-the-fly in a continuous stream. This can be highly undesirable, especially in multi-media applications which require smooth, uninterrupted audio/video streaming. The above referenced U.S. patent application entitled "A METHOD AND APPARATUS FOR EFFICIENTLY PROCESSING A MULTI-DIMENSIONAL CODE" discloses a method for reducing the processing time of a product code by processing only the horizontal and vertical codewords that have been flagged as containing errors (i.e., error free codewords are skipped). Still, there is a significant latency in reading the codewords from the data buffer in order to regenerate the error syndromes during each of the horizontal and vertical passes.

There is, therefore, a need for a faster, more efficient error correction processor for decoding a multi-dimensional code.

SUMMARY OF THE INVENTION

An efficient error correction processor is disclosed for correcting a multi-dimensional code comprising a first set of codewords that intersect with a second set of codewords. The error correction is carried out by performing iterative passes over the first and second set of codewords. The individual codewords are corrected using error syndromes which are computed as a function of the codeword data. In the preferred embodiment, the individual codewords are encoded according to a Reed-Solomon code and the error syndromes are computed as the modulo division of the codeword polynomial by the factors of a generator polynomial.

The error correction processor comprises a data buffer for storing the entire multi-dimensional codeword, wherein the individual codewords stored in the data buffer are corrected during the iterative passes. In order to minimize the latency in accessing the data buffer, the error correction processor comprises a syndrome buffer for storing the error syndromes for the individual codewords. In this manner, there is no need to read an individual codeword from the data buffer when the error syndromes are already available in the syndrome buffer. The syndrome buffer is preferably implemented as static ram (SRAM) which is very fast as compared to the data buffer which is implemented as dynamic ram (DRAM).

In a first embodiment, the error syndromes for the second set codewords are generated concurrent with generating the error syndromes for the first set codewords. When the pass over the first set codewords is completed, the error syndromes for the second set codewords are available immediately from the syndrome buffer-reading the second set codewords from the data buffer to generate the error syndromes is not necessary. This increases significantly the throughput of the error correction processor.

In a second embodiment, the syndrome buffer stores the error syndromes for both the first and second set codewords. The error syndromes for both the first and second set codewords are generated concurrently during the first pass over the first set codewords. In this manner, the only access to the data buffer after the first horizontal pass is to correct a data symbol—it is not necessary to read an entire codeword from the data buffer to regenerate the error syndromes because they are already available in the syndrome buffer.

In both embodiments, the error syndromes stored in the syndrome buffer are updated when a symbol is corrected in an intersecting codeword. For instance, if a symbol of a first set codeword is corrected, then for the second set codeword that intersects the first set codeword at the corrected symbol the error syndrome is read from the syndrome buffer and updated using the correction value. In the second embodiment wherein the error syndromes are stored for both the first and second set codewords, the error syndromes are automatically adjusted using the correction values according to the location of the corrected data symbol.

BRIEF DESCRIPTION OF THE DRAWINGS

The above and other aspects and advantages of the present invention will be better understood by reading the following detailed description of the invention in view of the drawings, wherein.

DETAILED DESCRIPTION OF THE PREFERRED EMBODIMENT

Overview

Figure 1:
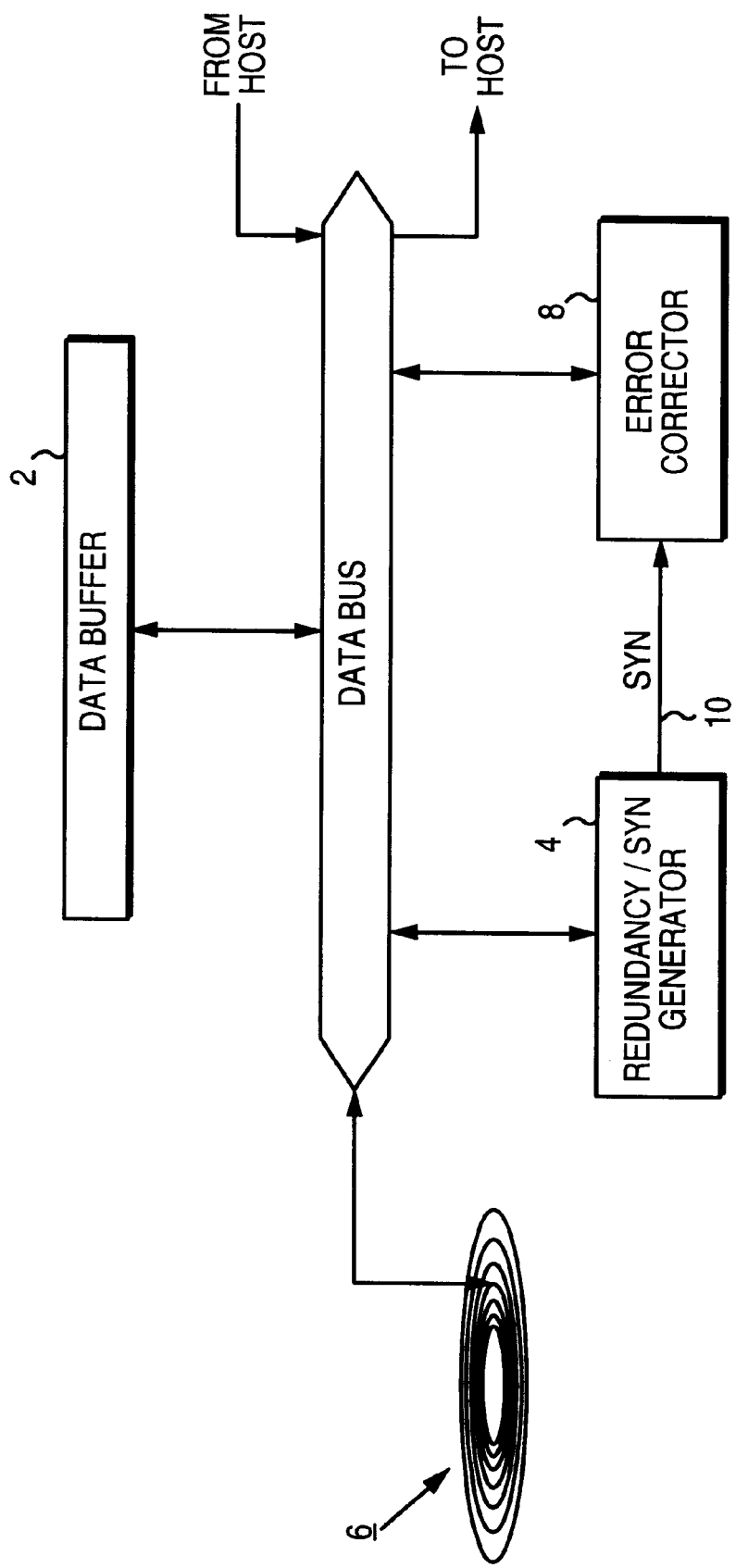
FIG. 1 is a block diagram of a prior art error correction processor for correcting a multi-dimensional codeword stored on a disk storage medium.

An overview of a typical prior art error correction processor for a disk storage device is shown in FIG. 1. During a write operation (assuming the storage device is not read-only), user data is transferred from the host computer and stored in a data buffer 2. A redundancy/syndrome generator 4 then reads the data from the data buffer 2 in order to generate the ECC redundancy symbols for the individual codewords of the multi-dimensional code. Once the subset codewords of the multi-dimensional code have been generated, CRC check symbols are generated over the subset codewords, and the entire multidimensional codeword is then written to the disk storage medium 6 which may be magnetic or optical.

In the preferred embodiment, the individual codewords are generated according to a Reed-Solomon code. A Reed-Solomon codeword C(x) is represented as a polynomial of the form:

$$C(x) = x^m \cdot D(x) + (x^m \cdot D(x)) \bmod G(x)$$

where D(x) is a data polynomial, G(x) is a generator polynomial and m is the degree of the generator polynomial G(x). The coefficients of the data polynomial D(x) are w-bit symbols of the data stream received from the host system and stored in the data buffer 2. To generate the codeword C(x), the data polynomial D(x) is multiplied by $x^m$ and then the ECC redundancy symbols are added, where the ECC redundancy symbols are generated as the modulo division:

$$(x^m \cdot D(x)) \bmod G(x).$$

The encoding process can be implemented simply using a linear feedback shift register (LFSR) as is well known by those skilled in the art.

During a read operation, the multi-dimensional codeword is read from the disk storage medium 6 and stored in the data buffer 2. The correction processor then begins the iterative passes over the first and second set of codewords. An individual codeword is read from the data buffer 2 and error syndromes $S_i$ computed by dividing the codeword polynomial C'(x) by the factors of the generator polynomial G(x):

$$S_i = C'(x) \bmod (x + \alpha^i)$$

when $$G(x) = \prod_{i=0}^{m-1} (x + \alpha^i)$$

where α is a primitive element of the finite field $GF(2^w)$. If the syndromes $S_i$ are non-zero, it indicates that the codeword C'(x) contains at least one symbol in error. The syndromes $S_i$ are transferred over line 10 to an error corrector 8 which computes the error locations and correction values. The symbol in error is then read from the data buffer 2, corrected, and the corrected symbol is restored to the data buffer 2.

Figure 2:
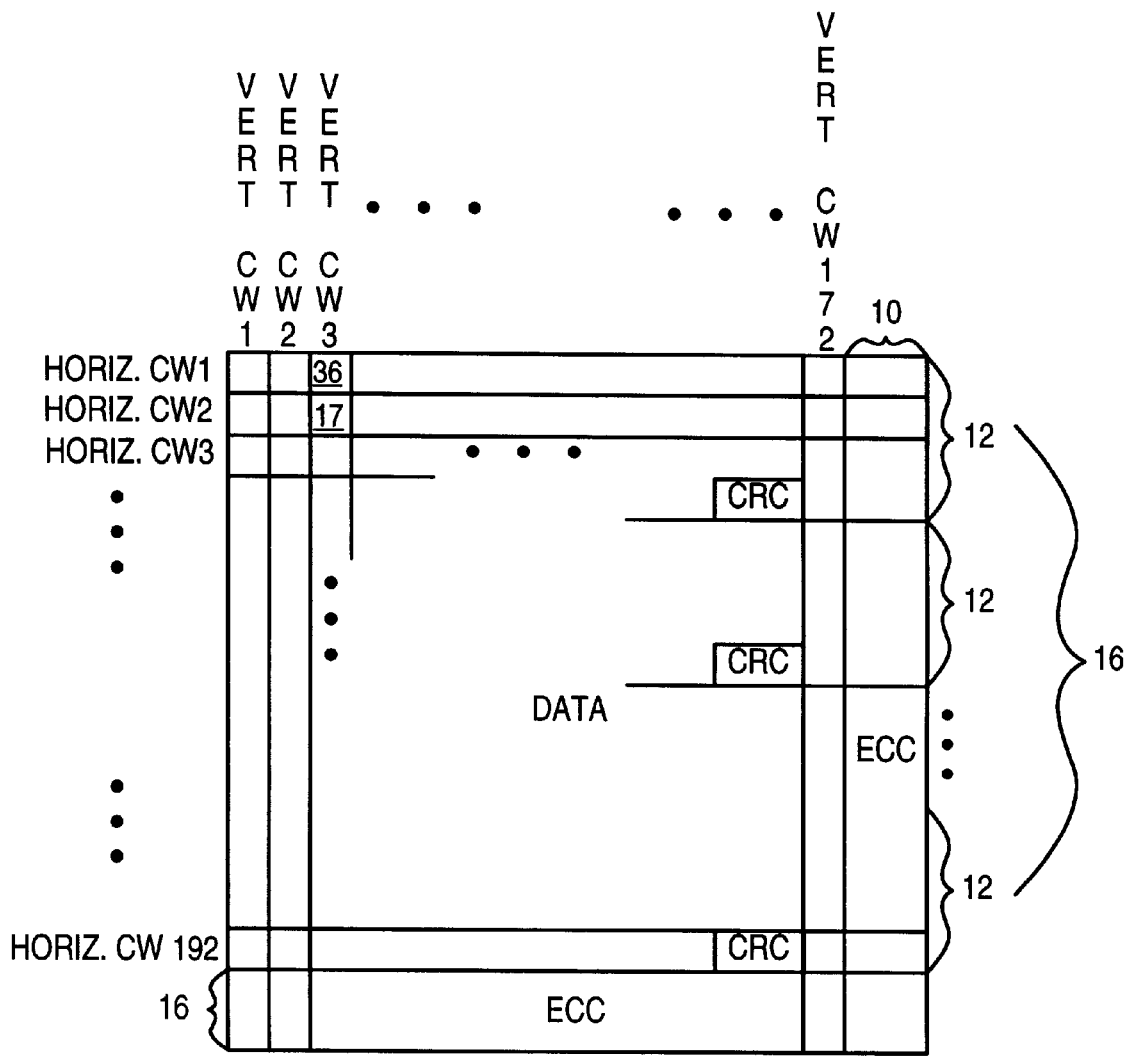
FIG. 2 is a two-dimensional product code typically employed in a digital video disk (DVD).

FIG. 2 shows an example format of a two-dimensional product code currently employed in a typical digital video disk (DVD) storage system. It comprises sixteen sectors, where each sector comprises twelve codewords for a total of 208 horizontal codewords and 182 vertical codewords. At the end of each sector are four CRC bytes for verifying the validity and completeness of the corrections to the user data at the end of the horizontal and vertical passes (see the above reference U.S. patent application entitled "ERROR CORRECTION AND CONCURRENT VERIFICATION OF A PRODUCT CODE"). Each horizontal codeword comprises 172 8-bit symbols of user data and 10 8-bit symbols of ECC redundancy. Each vertical codeword comprises 192 8-bit symbols of user data and 16 8-bit symbols of ECC redundancy.

The prior art error correction processor shown in FIG. 1 reads an entire codeword (horizontal or vertical) from the data buffer 2 in order to generate the error syndromes $S_i$ during each of the horizontal and vertical passes. This is inefficient due to the latency in accessing the data buffer 2, especially when several passes may be needed to correct the entire product code codeword.

Error Correction Processor

Figure 3:
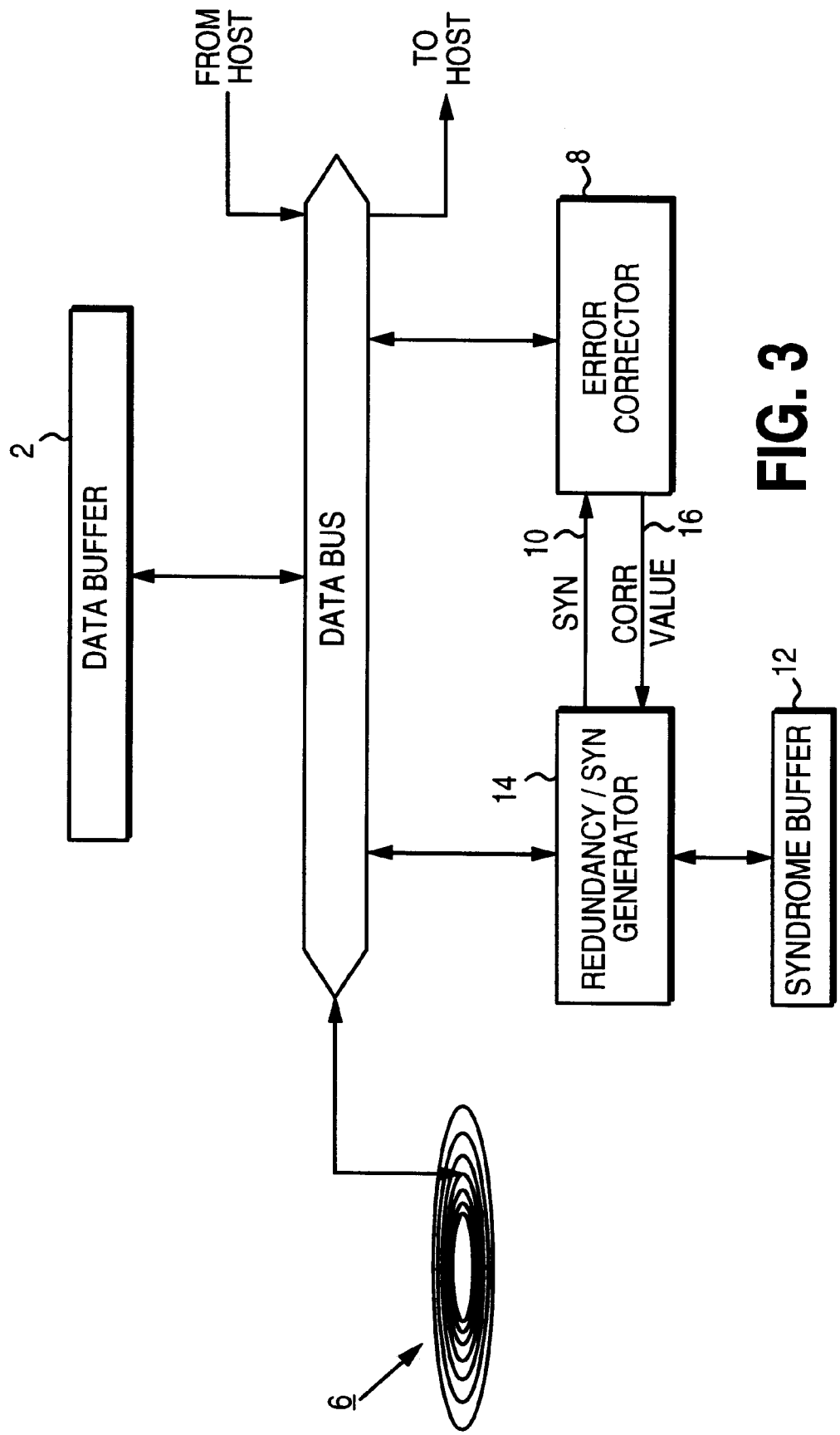
FIG. 3 is a block diagram of the error correction processor of the present invention including a syndrome buffer for storing error syndromes.

The error correction processor of the present invention which overcomes the drawbacks of the prior art is shown in FIG. 3. Similar to the error correction processor of FIG. 1, the present invention uses a data buffer 2 for storing write data received from the host and read data received from the disk storage medium. In contrast to FIG. 1, however, the present invention employs a syndrome buffer 12 for storing the error syndromes to avoid the latency in accessing the data buffer 2 to regenerate the error syndromes every time a codeword is processed. Furthermore, the syndrome generator 14 is modified to generate, concurrently, the error syndromes for the first and second set of intersecting codewords. In this manner, the error syndromes for the second set codewords are available immediately after processing the first set codewords—reading the second set codewords from the data buffer 2 to generate the error syndromes is not necessary.

The error corrector 8 operates substantially the same as in the prior art of FIG. 1, except that in addition the correction values are transmitted over line 16 to the syndrome generator 14 in order to update the error syndromes stored in the syndrome buffer 12. When a correction is made to a symbol in a second set codeword, the error syndromes for the second set codeword that intersects the first set codeword at the corrected symbol are updated using the correction value. Consider, for example, the two-dimensional product code shown in FIG. 2. If the third symbol 17 in the second horizontal codeword is corrected during the horizontal pass, then the error syndromes for the third vertical codeword are concurrently updated using the correction value. In this manner, the error syndromes for all of the vertical codewords are available immediately after completing a pass over the horizontal codewords, even when corrections are made to the horizontal codewords. This enables the error corrector 8 to begin correcting the vertical codewords immediately without having to read the codewords from the data buffer in order to regenerate the error syndromes.

The syndrome buffer 12 is preferably implemented as static ram (SRAM) which is very fast as compared to the data buffer 2 (the data buffer 2, which stores significantly more data than the syndrome buffer 12, is preferably implemented using more cost effective but slower dynamic ram (DRAM)). Furthermore, the syndrome buffer 12 preferably employs a wider data bus than the data buffer 2 so that multiple error syndromes can be accessed and updated in parallel.

Concurrent Syndrome Generator

Disclosed below are two embodiments for the syndrome generator 14 of the present invention. In a first embodiment, the syndromes for the vertical codewords are generated concurrently with generating the syndromes for the horizontal codewords during a horizontal pass. As described in greater detail below, the syndrome buffer 12 facilitates generating the vertical syndromes. Consequently, the syndromes for the vertical codewords stored in the syndrome buffer 12 are available immediately after the horizontal pass—the vertical codewords can be corrected without accessing the data buffer in order to generate the syndromes, thereby significantly reducing the error correction latency. This embodiment is particularly well suited to product codes that employ a large amount of ECC redundancy, such as in digital video disk (DVD) storage devices, because the corrections will usually be complete after a single pass over the horizontal and vertical codewords.

In a second embodiment of the present invention, which is directed at product codes employing less ECC redundancy and thus require multiple horizontal and vertical passes, the syndrome buffer 12 stores the error syndromes for both the horizontal and vertical codewords. Both sets of syndromes are generated concurrently during the first horizontal pass, and the syndromes are updated using the corrections values. In this manner, the latency in accessing the data buffer to regenerate the error syndromes is avoided for both the horizontal and vertical passes. The error correction is performed in a fraction of the time because passes subsequent to the first pass need only access the data buffer to make corrections to the data.

Figure 4:
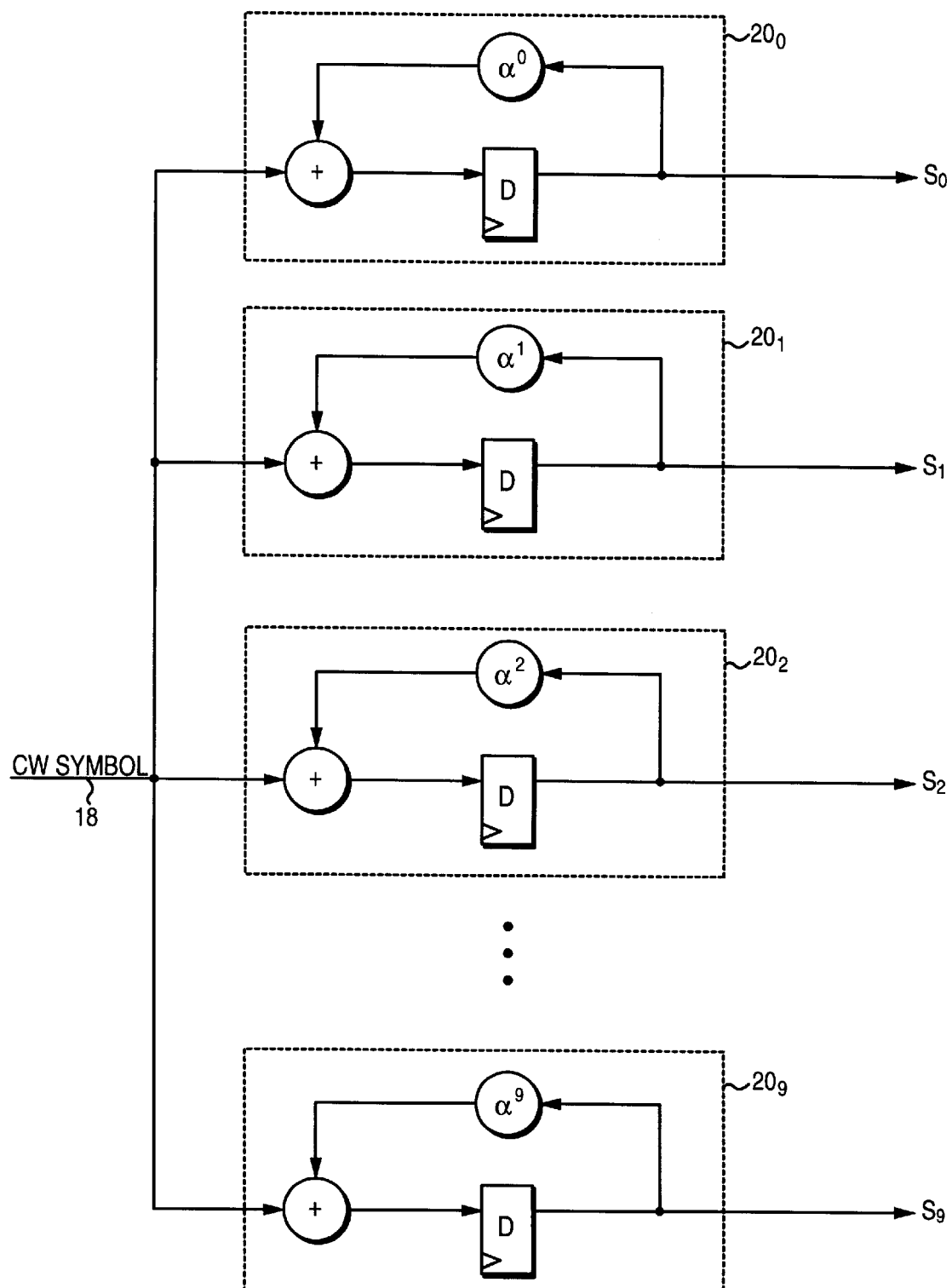
FIG. 4 shows detailed circuitry for generating the horizontal codeword error syndromes according to a first embodiment of the present invention.
Figure 5:
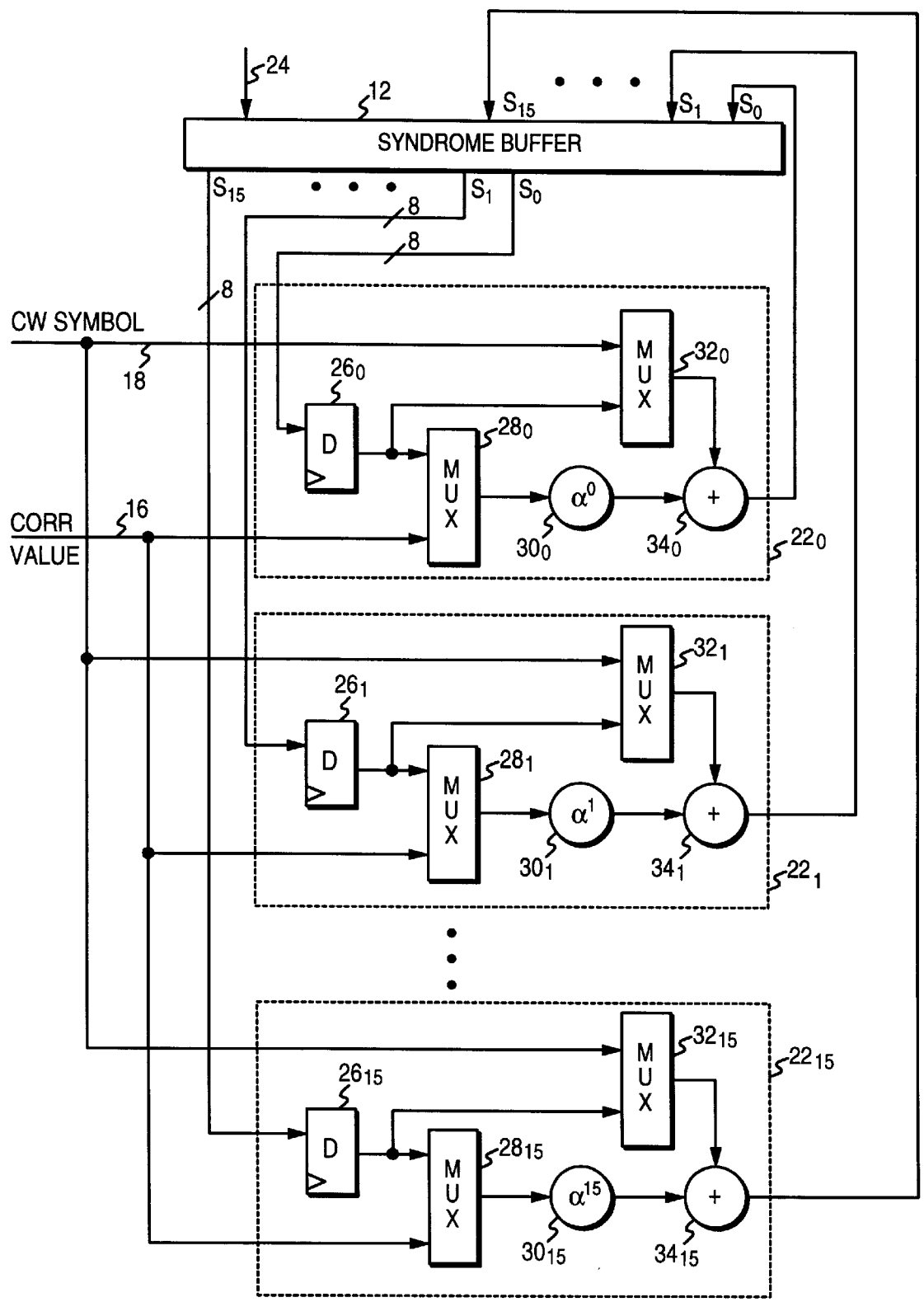
FIG. 5 shows detailed circuitry for generating the vertical codeword error syndromes concurrent with generating the error syndromes for the horizontal codewords.

The first embodiment of the present invention, which stores only the vertical error syndromes in the syndrome buffer 12, is understood with reference to FIG. 4 and FIG. 5. FIG. 4 shows the circuitry used to generate the error syndromes for the horizontal codewords during each horizontal pass. That is, the horizontal error syndromes are always regenerated, they are not stored in the syndrome buffer 12. To generate the horizontal error syndromes $S_i$, the circuitry in FIG. 4 computes the modulo division of each horizontal codeword C'(x) by the factors of the generator polynomial G(x):

$$S_i = C'(x) \; MOD \; (x+\alpha^i)$$

when $$G(x) = \prod_{i=0}^{m-1} (x + \alpha^i).$$

To carry out this computation, the symbols of a horizontal codeword (including the ECC redundancy) are read from the data buffer 2 sequentially and applied over line 18 to a bank of linear feedback shift registers (LFSR) $20_0$–$20_9$. In the preferred embodiment, each horizontal codeword comprises ten ECC redundancy symbols, as shown in FIG. 2, thus there are ten LFSRs in FIG. 4, each with a corresponding $\alpha^i$ coefficient multiplier in the feedback path. Each LFSR performs the modulo division for each factor of the generator polynomial G(x) to thereby generate the error syndromes $S_i$ according to the above equation. The circuitry disclosed in FIG. 4 is well known by those skilled in the art—the novel aspect of the present invention lies in concurrently generating the error syndromes for the vertical codewords, the details of which are shown in FIG. 5.

Mathematically, the error syndromes for the vertical codewords are computed in the same way as for the horizontal codewords described above. That is, the vertical error syndromes $S_i$ are generated by computing the modulo division of each vertical codeword C'(x) by the factors of the generator polynomial G(x). The prior art syndrome generators typically employ the same circuitry shown in FIG. 4 to generate the vertical error syndromes; that is, the symbols of a vertical codeword (including the ECC redundancy) are read from the data buffer 2 sequentially and shifted through a bank of LFSRs. In the present invention, the vertical error syndromes are generated concurrent with generating the horizontal error syndromes in order to avoid accessing the data buffer to read the vertical codewords during a vertical pass.

The circuitry for concurrently generating the vertical error syndromes is shown in FIG. 5, the operation of which is understood with reference to the product code shown in FIG. 2. The syndrome buffer 12 has the capacity to store 16 error syndromes $S_i$ for each of the 182 vertical codewords. The vertical error syndromes $S_i$ in the syndrome buffer 12 are initialized to zero at the beginning of the first horizontal pass. When processing the first horizontal codewords, the symbols are read from the data buffer 2 sequentially and applied over line 18 to the LFSR of FIG. 4 to generate the horizontal error syndromes. The symbols are simultaneously applied over line 18 to the circuitry shown in FIG. 5 to generate the vertical error syndromes. Similar to FIG. 4, FIG. 5 comprises a bank of syndrome generating circuits $22_0$–$22_{15}$ for computing the modulo division of the vertical codeword symbols by the 16 factors of the generator polynomial G(x) (each vertical codeword comprises 16 ECC redundancy symbols).

To understand the individual syndrome generating circuits $22_0$–$22_{15}$ shown in FIG. 5, consider the operation when the first horizontal codeword is read from the data buffer. The first symbol of the first horizontal codeword corresponds to the first symbol of the first vertical codeword. Thus, a control line 24 retrieves the 16 vertical error syndromes (8-bits each) from the syndrome buffer 12 for the first vertical codeword. Each 8-bit vertical error syndrome is latched into a corresponding register $26_0$–$26_{15}$, selected as the output of a multiplexer $28_0$–$28_{15}$, and multiplied by a corresponding $\alpha^i$ feedback coefficient $30_0$–$30_{15}$. The codeword symbol on line 18 is selected as the output of a multiplexer $32_0$–$32_{15}$ which is added to the output of the coefficient multiplier at adder $34_0$–$34_{15}$. The updated syndromes at the output of the adders $34_0$–$34_{15}$ are then restored to the syndrome buffer 12. When processing the second symbol of the first horizontal codeword, the control line 24 retrieves the 16 vertical error syndromes from the syndrome buffer 12 for the second vertical codeword, and the above procedure is re-iterated. This process continues for each of the horizontal codewords and at the end of the horizontal pass, the error syndromes for correcting the vertical codewords are stored in the syndrome buffer 12.

If a horizontal codeword is corrected during a horizontal pass, then the corresponding vertical error syndromes stored in the syndrome buffer 12 must be updated to account for the corrected symbol. The syndrome generator 14 and the error corrector 8 of FIG. 3 preferably operate on adjacent codewords. In other words, while the syndrome generator 14 is generating the error syndromes for a current horizontal codeword, the error corrector 8 is correcting symbols for the previous horizontal codeword. In addition, the error correction trails generation of the horizontal error syndromes to simplify adjusting the vertical error syndromes with the correction values.

Consider, for example, that the syndrome generator 14 is generating the error syndromes for the second horizontal codeword in FIG. 2, while the error corrector 8 is correcting the first horizontal codeword. Assume that the syndrome generator 14 has past the third symbol 17 of the second codeword and the third symbol 36 of the first codeword is in error. The error corrector 8 generates a correction value used to correct the third symbol 36 of the first horizontal codeword stored in the data buffer 2, and the correction value is also applied over line 16 to the vertical syndrome generating circuits $22_0$–$22_{15}$ of FIG. 5. The control line 24 retrieves the vertical error syndromes from the syndrome buffer 12 for the third vertical codeword which are latched into the registers $26_0$–$26_{15}$. The outputs of the registers $26_0$–$26_{15}$ are then selected through the multiplexer $32_0$–$32_{15}$ as an input to the adders $34_0$–$34_{15}$. The correction value applied over line 16 is selected as the output of multiplexer $28_0$–$28_{15}$, multiplied by the corresponding $\alpha^i$ feedback coefficient $30_0$–$30_{15}$, and then added to the vertical error syndromes at adder $34_0$–$34_{15}$. Multiplying the correction value by the corresponding $\alpha^i$ feedback coefficient $30_0$–$30_{15}$ is necessary to account for the offset between the current vertical error syndrome value and the symbol being corrected (i.e., the offset of one symbol in the vertical codeword).

At the end of a horizontal pass, the error syndromes for the vertical codewords will be completely generated and available for immediate processing. Thus, to execute a vertical pass, the vertical error syndromes are simply read from the syndrome buffer 12 and used by the error corrector 8 to correct the vertical codewords. If after a vertical pass the CRC symbols of the product code indicate that errors still remain, then the above process is re-iterated (i.e., the horizontal and vertical error syndromes are regenerated during the next horizontal pass).

In an alternative embodiment of the present invention, both the horizontal and vertical syndromes are stored in the syndrome buffer 12 as they are being generated concurrently during the first horizontal pass. In this manner, it is not necessary to regenerate the horizontal syndromes during subsequent horizontal passes as in the previously described embodiment. The syndromes are simply retrieved during the horizontal and vertical passes and used to correct the codewords. This embodiment is particularly advantageous where multiple passes are necessary to correct the product code (e.g., if the ECC redundancy symbols are reduced, or if the SNR is decreased by increasing the recording density).

Figure 6A:
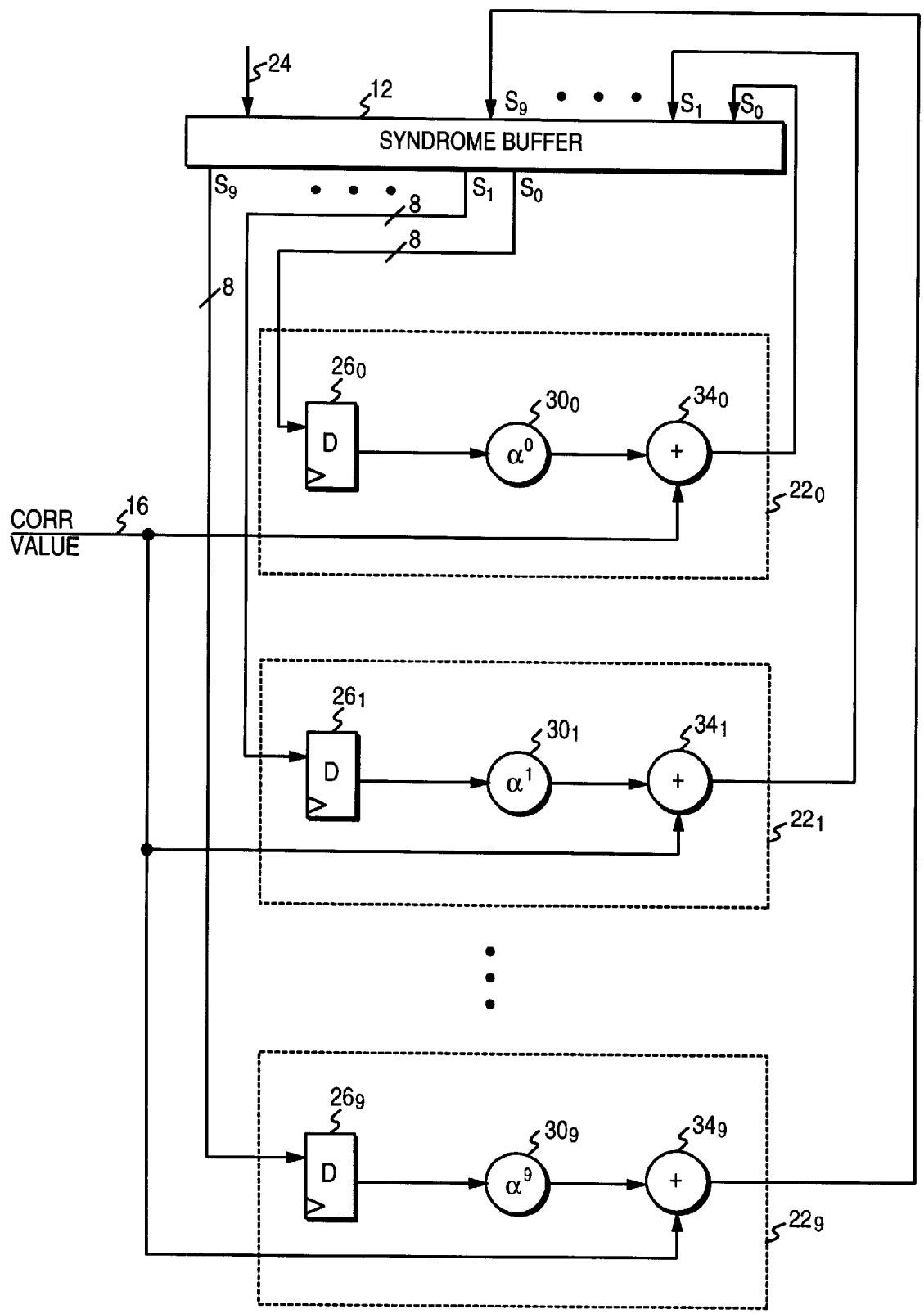
FIGS. 6A and 6B show, for an alternative embodiment of the present invention, the circuitry for updating the horizontal and vertical error syndromes, respectively, when the syndrome buffer stores the error syndromes for both the horizontal and vertical codewords.
Figure 6B:
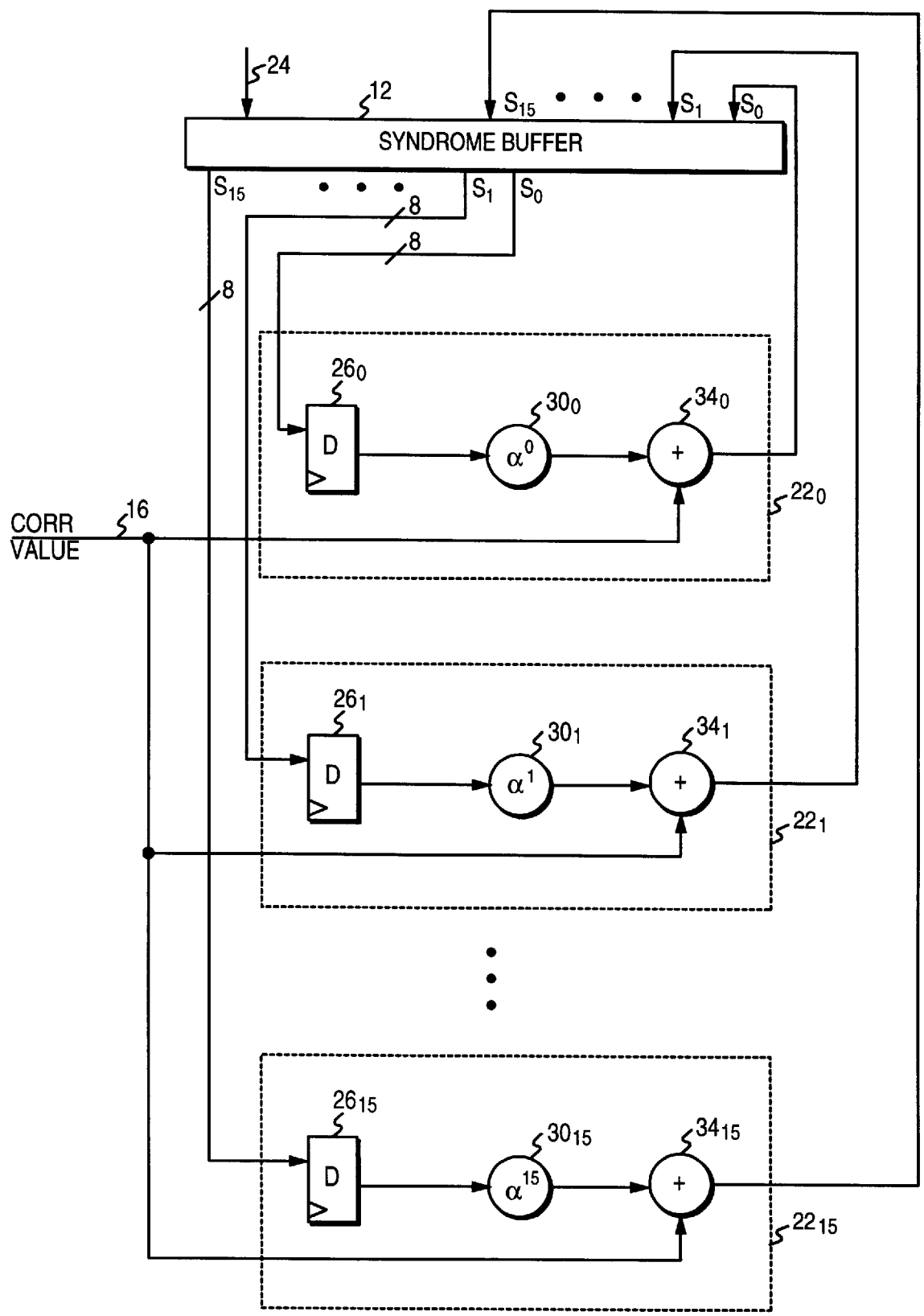

The circuitry for updating the vertical and horizontal syndromes using the correction values for this embodiment is shown in FIGS. 6A and 6B, respectively. These circuits operate substantially the same as the circuitry of FIG. 5, except that it is not necessary to multiply the error correction value 16 by $\alpha^i$ because there is no need to account for an offset. In the preferred embodiment, the circuitry of FIG. 4 and FIG. 5 for initially generating the horizontal and vertical error syndromes during the first horizontal pass is shared with the circuitry of FIGS. 6A and 6B for updating the error syndromes during subsequent passes. The syndrome buffer(s) of FIGS. 6A and 6B may be implemented separately, or they may be implemented as a single buffer (i.e., a single integrated SRAM). In any event, the addressing over control line 24 determines which set of error syndromes (horizontal or vertical) are retrieved from the syndrome buffer at the appropriate times.

Figure 7A:
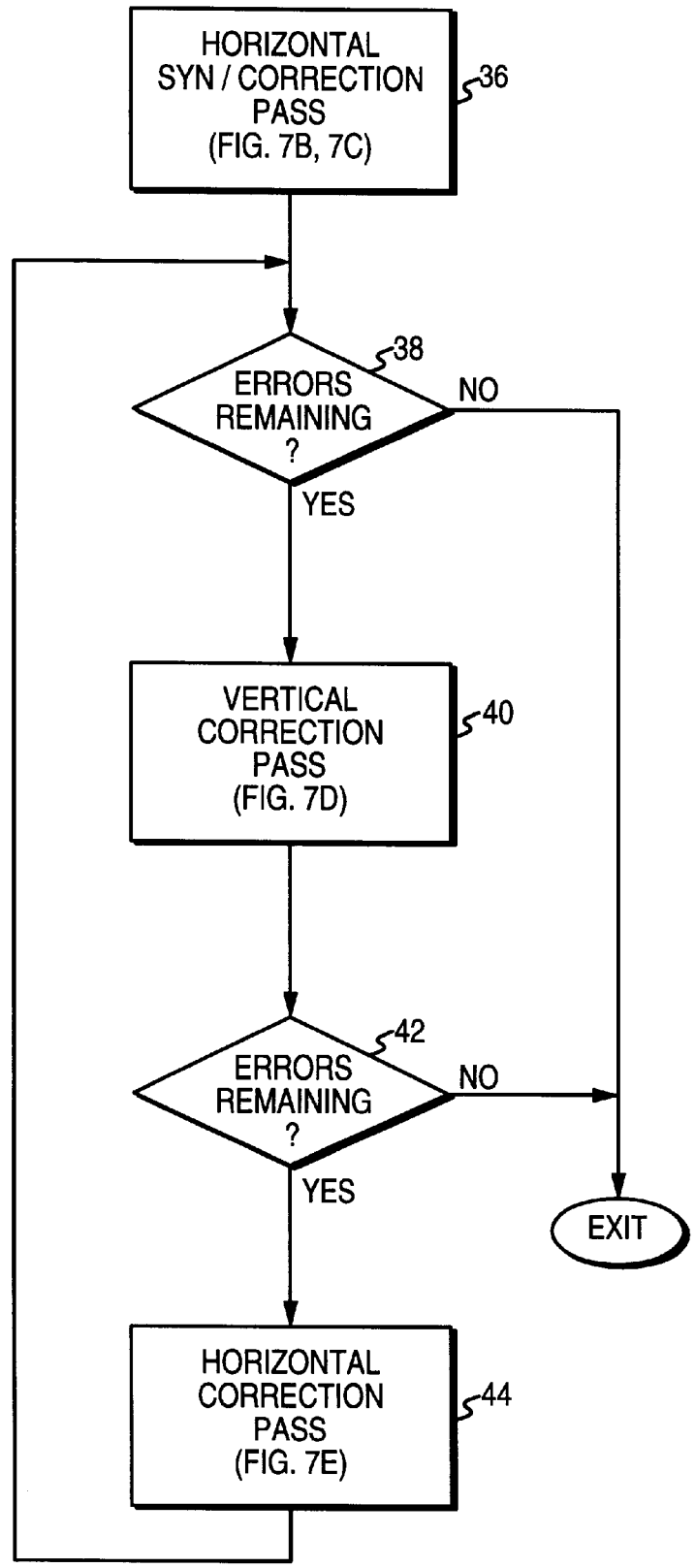
FIG. 7A is a flow diagram executed by the error correction processor for processing a product code using horizontal and vertical error syndromes stored in the syndrome buffer.

FIG. 7A is a flow diagram illustrating the operation of the present invention when both the horizontal and vertical syndromes are stored in the syndrome buffer. First, during the first horizontal pass 36, the horizontal and vertical syndromes are generated concurrently and stored in the syndrome buffer. Also during the first horizontal pass 36, the horizontal codedwords are corrected and the correction values used to update the vertical syndromes. After the first and subsequent horizontal passes, the validity and completeness of the corrections to the product code are verified using the CRC symbols at step 38. If errors still remain after a horizontal pass, then a vertical pass is executed to correct vertical codewords at step 40, wherein the correction values are used to update the horizontal syndromes stored in the syndrome buffer. After a vertical pass, the validity and completeness of the corrections are again verified using the CRC symbols at step 42. If errors still remain after a vertical pass, then another horizontal pass is executed at step 44 to correct the horizontal codewords using the horizontal syndromes stored in the syndrome buffer (i.e., the horizontal syndromes are not regenerated as in the previously described embodiment). The horizontal and vertical passes are re-iterated until the product code is corrected or deemed uncorrectable.

Figure 7B:
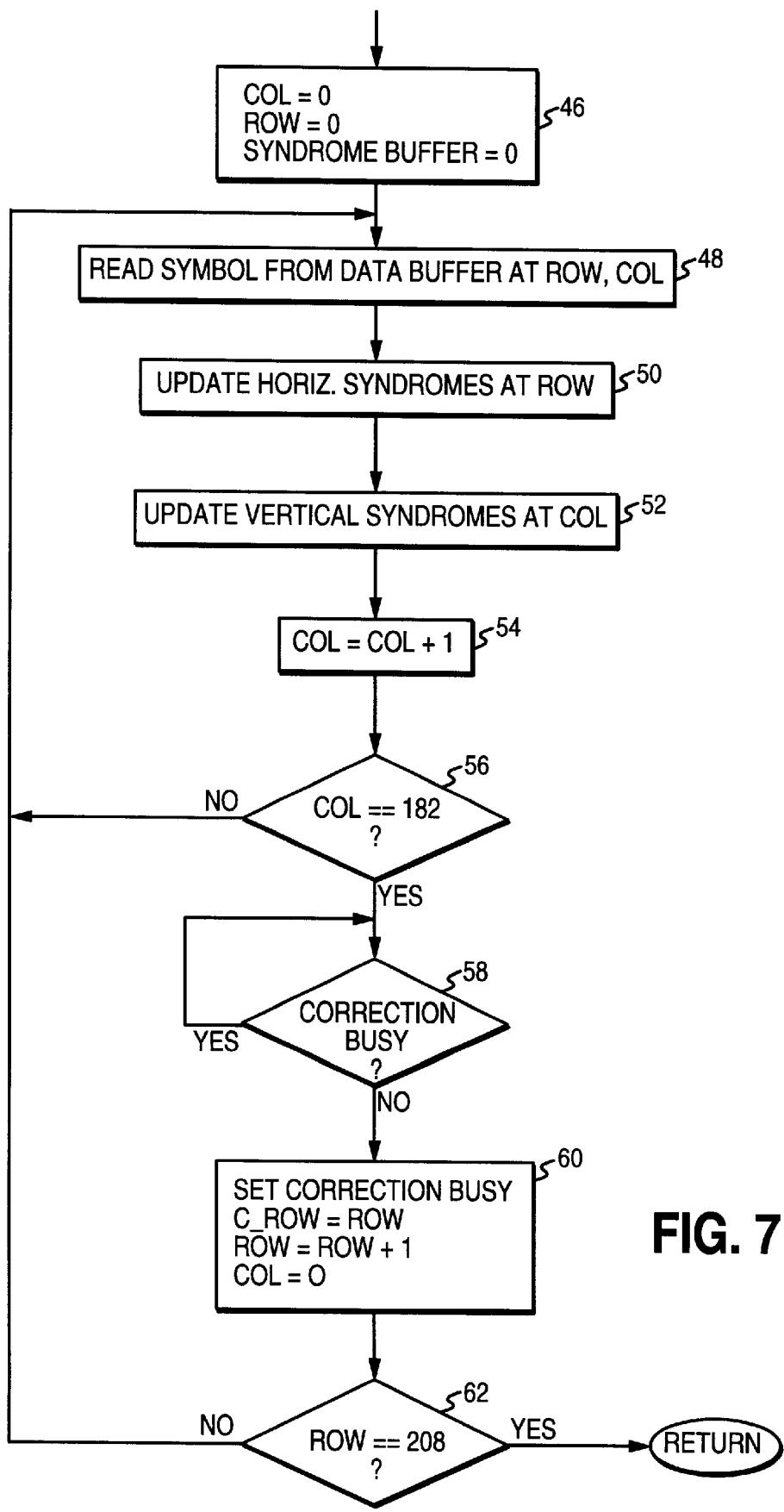
FIG. 7B is a flow diagram for concurrently generating the horizontal and vertical error syndromes during the first pass over the horizontal codewords.
Figure 7C:
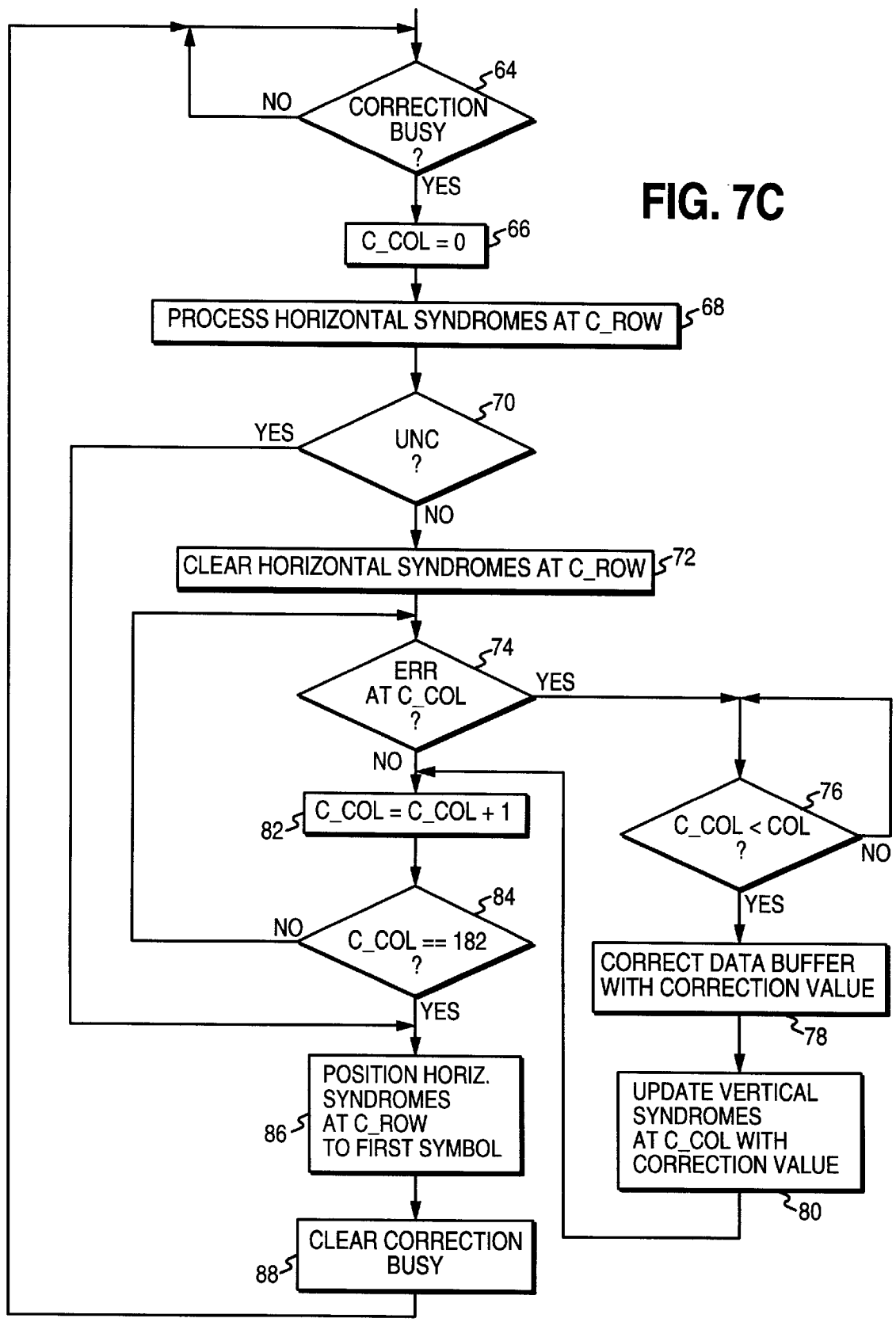
FIG. 7C is a flow diagram for correcting the horizontal codewords during the first horizontal pass, and for updating the vertical error syndromes stored in the syndrome buffer using the correction values.

The flow diagram for concurrently generating the horizontal and vertical syndromes during the first horizontal pass is shown in FIG. 7B, and the flow diagram for correcting the horizontal codewords and updating the vertical syndromes using the correction values during the first pass is shown in FIG. 7C (the flow diagrams of FIG. 7B and 7C are executed in parallel). Referring to FIG. 7B, at step 46 a COL and ROW variable are initialized to zero and the syndrome buffer is cleared. Then for the horizontal codeword at ROW, a symbol is read at step 48 and used to update the horizontal syndromes at step 50 using the circuitry of FIG. 4 as described above. At step 52 of FIG. 7B, the circuitry of FIG. 5 is used to update the vertical error syndromes for the vertical codeword at COL as described above. The COL variable is then incremented at step 54, and the next symbol for the current horizontal codeword is used to update the horizontal and vertical syndromes.

When the COL variable equals 182 at step 56, the last symbol for the current horizontal codeword has been read. At step 58, a loop is executed to wait for the error correction procedure (flow diagram of FIG. 7C) to finish processing the previous horizontal codeword. When finished correcting the previous codeword, a correction flag is reset to not busy at step 88 of FIG. 7C. At step 60 of FIG. 7B, the correction flag is set to busy, a C_ROW variable is set to the current ROW, the ROW variable is incremented, and the COL variable is reset to zero. At this point, the correction procedure of FIG. 7C is executed to correct the current horizontal codeword (i.e., at C_ROW) concurrent with the syndromes being generated for the next horizontal codeword (i.e., at ROW).

Referring to FIG. 7C, a loop is executed at step 64 to wait for the syndrome generator procedure of FIG. 7B to finish processing the current horizontal codeword and set the correction flag to busy. At step 66, a C_COL variable, which tracks the current column during correction, is reset to zero (i.e., reset to the first symbol in the horizontal codeword being corrected). The syndromes for the horizontal codeword being corrected are processed at step 68 to generate the error locator polynomial and to determine whether the roots correspond to valid symbol locations. If at step 70 the syndromes indicate there are too many errors, or if the roots of the error locator polynomial point to invalid symbols, then the codeword is deemed uncorrectable. If the codeword is correctable at step 70, then at step 72 the syndromes for the horizontal codeword at C_ROW are cleared (set to zero). A loop is then executed to correct the horizontal codeword at C_ROW. If at step 74 the symbol at C_COL is in error, then a branch is executed to correct the symbol stored in the data buffer and to update the vertical syndromes using the correction value. The correction is delayed until C_COL is less than COL at step 76; that is, the error correction procedure of FIG. 7C waits until the syndrome generation procedure of FIG. 7B has passed the current correction column C_COL. This is necessary in order for the circuitry of FIG. 5 to work correctly because it multiplies the correction value 16 by $\alpha^i$ 30$_i$ to account for the offset of one symbol. At step 78 of FIG. 7C, the horizontal codeword symbol stored in the data buffer is corrected using the correction value, and at step 80 the correction value is used to update the vertical syndromes for the vertical codeword at C_COL as described above with reference to FIG. 5. At step 82 the variable C_COL is incremented to the next symbol in the horizontal codeword and the correction loop is re-executed.

When C_COL equals 182 at step 84, the last symbol of the horizontal codeword being corrected has been processed. To facilitate updating the error syndromes for the current horizontal codeword during the next vertical pass, its error syndromes are repositioned to the first codeword symbol at step 86. This is carried out by the following computation:

$$SYN_i = SYN_i \cdot x^{-182} \ MOD \ (x+\alpha^i).$$

Examples for performing similar computations using different offset values is provided in the above referenced U.S. patent application entitled "A METHOD AND APPARATUS FOR EFFICIENTLY PROCESSING A MULTI-DIMENSIONAL CODE."

At step 88 of FIG. 7C, the correction busy flag is cleared and the correction procedure waits at step 64 for the syndrome generation procedure of FIG. 7B to finish generating the error syndromes for the next horizontal codeword. The syndrome generation and error correction procedures execute in parallel until the last horizontal codeword has been processed (i.e., ROW equals 208 at step 62 of FIG. 7B). If at step 38 of FIG. 7A errors still remain after the first horizontal pass, then a vertical pass is executed at step 40, the flow diagram for which is set forth in FIG. 7D.

At step 90, the correction variables C_COL and C_ROW are reset to zero (i.e., reset to the first symbol of the first vertical codeword). The syndromes for the vertical codeword being corrected are then processed at step 92 to generate the error locator polynomial and to determine whether the roots correspond to valid symbol locations. If at step 94 the syndromes indicate there are too many errors, or if the roots of the error locator polynomial point to invalid symbols, then the codeword is deemed uncorrectable. If the codeword is correctable at step 94, then at step 96 the syndromes for the vertical codeword at C_COL are cleared (set to zero). A loop is then executed to correct the vertical codeword at C_COL. If at step 98 the symbol at C_ROW is in error, then a branch is executed to correct the symbol stored in the data buffer at step 100 and to update the horizontal syndromes using the correction value at step 102. The circuitry of FIG. 6A is used to update the horizontal syndromes in a similar manner as described above with reference to FIG. 5. The horizontal syndromes at C_ROW are retrieved from the syndrome buffer 12, multiplied by $\alpha^1$ 30$_i$, added to the correction value 34$_i$, and then returned to the syndrome buffer 12. Although not shown in the flow chart of FIG. 7D, the horizontal syndromes are updated for each symbol in the codeword even if no correction is made (i.e., even if the correction value is zero). This simplifies the syndrome update circuitry of FIG. 6A—it requires only a $\alpha^i$ multiplier 30$_i$ to position the error syndrome to the next codeword symbol.

Figure 7D:
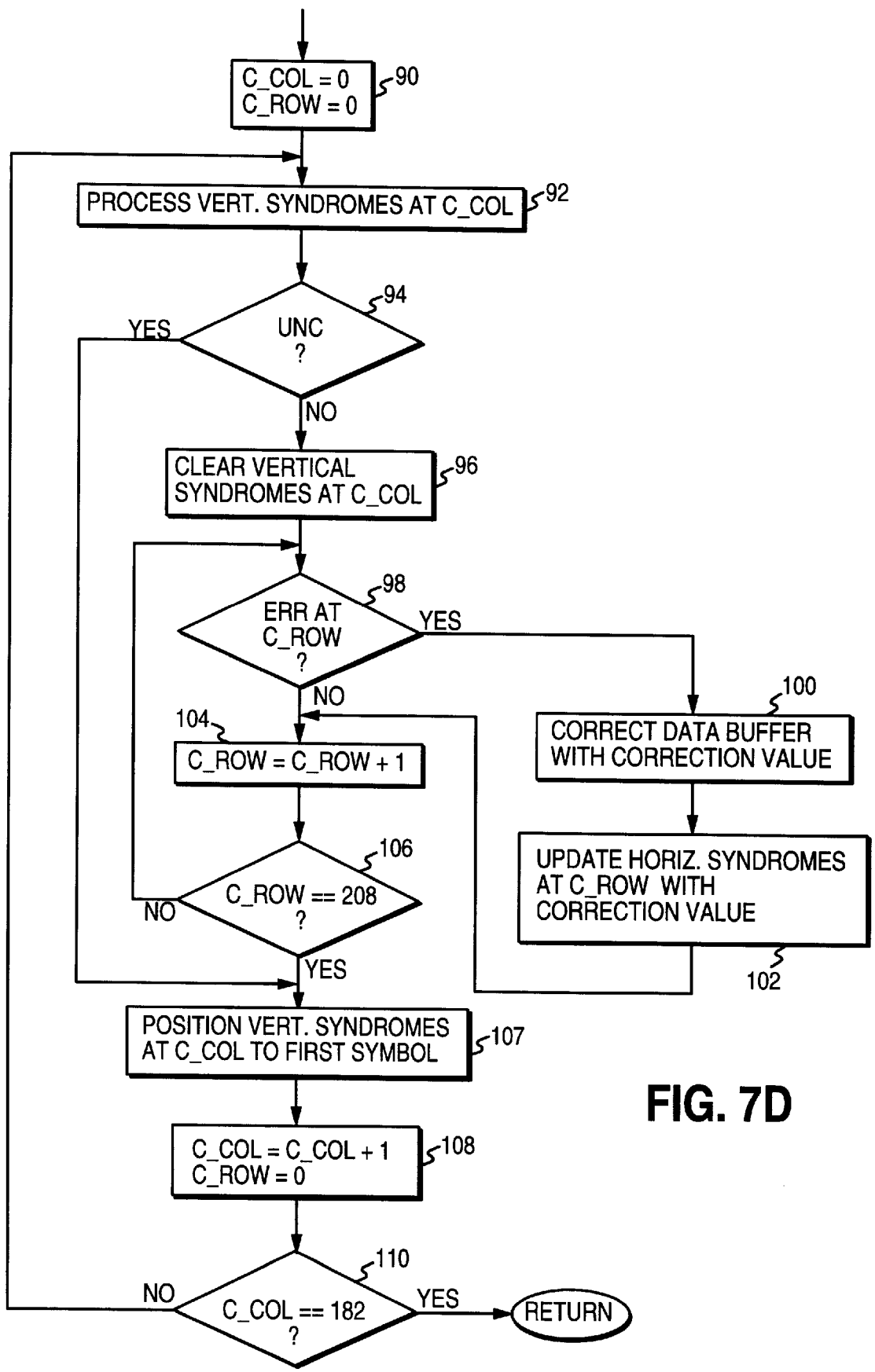
FIG. 7D is a flow diagram for correcting the vertical codewords during a vertical pass using the vertical error syndromes stored in the syndrome buffer, and for updating the horizontal error syndromes stored in the syndrome buffer using the correction values.

At step 104 of FIG. 7D, the C_ROW variable is incremented to the next symbol in the current vertical codeword. If at step 106 C_ROW equals 208, then the last symbol of the current vertical codeword has been processed. After the last symbol has been processed (or if the codeword is uncorrectable at step 94), then the error syndromes for the vertical codeword at C_COL are repositioned to the first symbol of the codeword at step 107. This is carried out by the following computation:

$$SYN_i = SYN_i \cdot x^{-208} \ MOD \ (x+\alpha^i).$$

At step 108, the C_COL variable is incremented to the next vertical codeword and the C_ROW variable is reset to zero to point to the first symbol of the next vertical codeword. The correction procedure of FIG. 7D is re-iterated until C_COL equals 182 at step 110 indicating that all of the vertical codewords have been processed.

At the end of a vertical pass, the CRC symbols are used to verify whether the corrections made are valid and complete at step 42 of FIG. 7A. If errors still remain in the product code at step 42, then a horizontal correction pass is executed at step 44, the details for which are set forth in the flow diagram of FIG. 7E.

At step 112, the correction variables C_COL and C_ROW are reset to zero (i.e., reset to the first symbol of the first horizontal codeword). The syndromes for the horizontal codeword being corrected are then processed at step 114 to generate the error locator polynomial and to determine whether the roots correspond to valid symbol locations. If at step 116 the syndromes indicate there are too many errors, or if the roots of the error locator polynomial point to invalid symbols, then the codeword is deemed uncorrectable. If the codeword is correctable at step 116, then at step 118 the syndromes for the horizontal codeword at C_ROW are cleared (set to zero). A loop is then executed to correct the horizontal codeword at C_ROW. If at step 120 the symbol at C_COL is in error, then a branch is executed to correct the symbol stored in the data buffer at step 122 and to update the vertical syndromes using the correction value at step 124. The circuitry of FIG. 6B is used to update the vertical syndromes in a similar manner as described above with reference to FIG. 6A for updating the horizontal error syndromes during a vertical pass. The vertical syndromes at C_COL are retrieved from the syndrome buffer 12, multiplied by $\alpha^i$ 30$_i$, added to the correction value 34$_i$, and then returned to the syndrome buffer 12. Although not shown in the flow chart of FIG. 7E, the vertical syndromes are updated for each symbol in the codeword even if no correction is made (i.e., even if the correction value is zero). This simplifies the syndrome update circuitry of FIG. 6B—it requires only a $\alpha^i$ multiplier $30_i$ to position the error syndrome to the next codeword symbol.

Figure 7E:
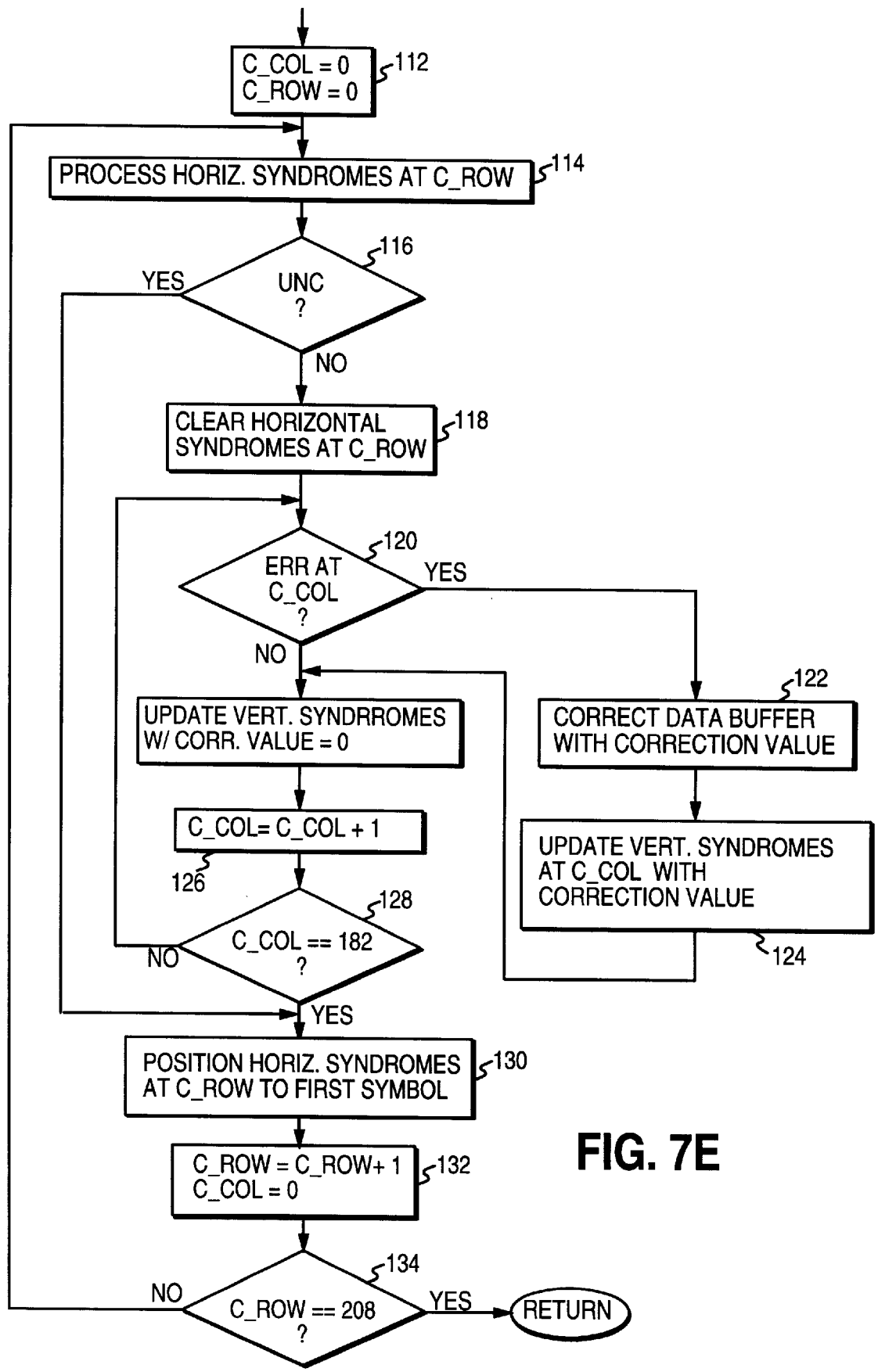
FIG. 7E is a flow diagram for correcting the horizontal codewords during subsequent horizontal passes using the horizontal error syndromes stored in the syndrome buffer, and for updating the vertical error syndromes stored in the syndrome buffer using the correction values.

At step 126 of FIG. 7E, the C_COL variable is incremented to the next symbol in the current horizontal codeword. If at step 128 C_COL equals 182, then the last symbol of the current horizontal codeword has been processed. After the last symbol has been processed (or if the codeword is uncorrectable at step 116), then the error syndromes for the horizontal codeword at C_ROW are repositioned to the first symbol of the codeword at step 130. This is carried out by the above computation:

$$SYN_i = SYN_i \cdot x^{-182} \ MOD \ (x+\alpha^i).$$

At step 132, the C_ROW variable is incremented to the next horizontal codeword and the C_COL variable is reset to zero to point to the first symbol of the next horizontal codeword. The correction procedure of FIG. 7E is re-iterated until C_ROW equals 208 at step 134 indicating that all of the horizontal codewords have been processed.

Referring again to FIG. 7A, after completing a horizontal pass at step 44, the CRC symbols are used to verify wether the corrections made to the product code are valid and complete at step 38. If errors still remain, then another vertical pass is executed at step 40. The iterative horizontal and vertical passes continue until the product code is corrected or deemed uncorrectable.

The objects of the invention have been fully realized through the embodiments disclosed herein. Those skilled in the art will appreciate that the various aspects of the invention can be achieved through different embodiments without departing from the essential function. For example, the product code shown in FIG. 2 is typically employed in digital video disks (DVDs), but the present invention is equally applicable to other product code formats, including the format used in compact disks (CDs). Furthermore, the present invention could be applied to other multi-dimensional codes, not just product codes. Thus, the particular embodiments disclosed are illustrative and not meant to limit the scope of the invention as appropriately construed by the following claims.

We claim:

1. An error correction processor for correcting errors in digital data recorded on a storage medium in the form of a multi-dimensional code comprising a first set of codewords that intersect with a second set of codewords, the error correction processor comprising:

(a) a data buffer for storing the digital data read from the storage medium;
    (b) a first syndrome buffer for storing first error syndromes associated with the first set of codewords;
    (c) a syndrome generator, responsive to the digital data stored in the data buffer and the first error syndromes stored in the first syndrome buffer, for concurrently generating the first error syndromes and second error syndromes for the first and second set of codewords, respectively; and
    (d) an error corrector, responsive to the first and second error syndromes, for correcting the digital data stored in the data buffer.

2. The error correction processor as recited in claim 1, wherein:

(a) the syndrome generator processes consecutive symbols of a second set codeword in generating a second error syndrome; and
    (b) the syndrome generator updates a first error syndrome stored in the first syndrome buffer using the symbols of the second set codeword that intersect with the symbols of a first set codeword.

3. The error correction processor as recited in claim 2, wherein the syndrome generator addresses the first syndrome buffer by a location of the intersecting symbols of the first and second set codewords.

4. The error correction processor as recited in claim 2, wherein:

(a) the error corrector generates an error correction value in response to a second syndrome for correcting a symbol in the second set codeword; and
    (b) the syndrome generator updates the first error syndrome stored in the first syndrome buffer using the error correction value.

5. The error correction processor as recited in claim 4, wherein:

(a) the error correction value corresponds to a previous second set codeword that is corrected while the syndrome generator generates error syndromes for a current second set codeword; and
    (b) the syndrome generator multiplies the error correction value by a constant to account for an offset between the previous and current second set codewords.

6. The error correction processor as recited in claim 1, wherein:

(a) the error corrector generates an error correction value in response to a second syndrome for correcting a symbol in a second set codeword; and
    (b) the syndrome generator updates a first error syndrome stored in the first syndrome buffer using the error correction value.

7. The error correction processor as recited in claim 1, wherein the syndrome generator generates the second error syndromes by dividing data symbols of a second set codeword by roots of a generator polynomial.

8. The error correction processor as recited in claim 7, wherein the syndrome generator divides a data symbol of the second set codeword by at least two roots of the generator polynomial in parallel.

9. The error correction processor as recited in claim 1, wherein the syndrome generator generates the first error syndromes by dividing data symbols of a first set codeword that intersect with a second set codeword by roots of a generator polynomial.

10. The error correction processor as recited in claim 1, further comprising a second syndrome buffer for storing the second error syndromes for the second set codewords.

11. The error correction processor as recited in claim 10, wherein the syndrome generator updates a second error syndrome stored in the second syndrome buffer using the symbols of the second set codeword.

12. The error correction processor as recited in claim 10, wherein:

(a) the error corrector generates an error correction value in response to a first syndrome for correcting a symbol in a first set codeword; and
    (b) the syndrome generator updates a second error syndrome stored in the second syndrome buffer using the error correction value.

13. The error correction processor as recited in claim 12, wherein before updating the second error syndrome using the error correction value, the syndrome generator adjusts the second error syndrome with respect to the location of the corrected symbol in the first set codeword.

14. A method of correcting errors in digital data recorded on a storage medium in the form of a multi-dimensional code comprising a first set of codewords that intersect with a second set of codewords, comprising the steps of:
   (a) storing the digital data read from the storage medium in a data buffer;
   (b) storing first error syndromes associated with the first set of codewords in a first syndrome buffer;
   (c) concurrently generating the first error syndromes and second error syndromes for the first and second set of codewords, respectively, using the digital data stored in the data buffer and the first error syndromes stored in the first syndrome buffer; and
   (d) correcting the digital data stored in the data buffer using the first and second error syndromes.

15. The method of correcting errors in digital data as recited in claim 14, wherein the step of concurrently generating the first error syndromes and the second error syndromes comprises the steps of:
   (a) processing consecutive symbols of a second set codeword to generate a second error syndrome; and
   (b) updating a first error syndrome stored in the first syndrome buffer using the symbols of the second set codeword that intersect with the symbols of a first set codeword.

16. The method of correcting errors in digital data as recited in claim 15, further comprising the step of addressing the first syndrome buffer by a location of the intersecting symbols of the first and second set codewords.

17. The method of correcting errors in digital data as recited in claim 15, wherein:
   (a) the step of correcting the digital data stored in the data buffer comprises the step of generating an error correction value in response to a second syndrome for correcting a symbol in the second set codeword; and
   (b) the step of updating the first error syndrome stored in the first syndrome buffer uses the error correction value.

18. The method of correcting errors in digital data as recited in claim 17, wherein:
   (a) the error correction value corresponds to a previous second set codeword that is corrected while generating error syndromes for a current second set codeword; and
   (b) the step of updating the first error syndrome comprises the step of multiplying the error correction value by a constant to account for an offset between the previous and current second set codewords.

19. The method of correcting errors in digital data as recited in claim 14, wherein:
   the step of correcting the digital data stored in the data buffer comprises the step of generating an error correction value in response to a second syndrome for correcting a symbol in the second set codeword; and
   (b) the step of updating the first error syndrome stored in the first syndrome buffer uses the error correction value.

20. The method of correcting errors in digital data as recited in claim 14, wherein the step of generating the second error syndromes comprises the step of dividing data symbols of a second set codeword by roots of a generator polynomial.

21. The method of correcting errors in digital data as recited in claim 20, wherein the step of dividing comprises the step of dividing a data symbol of the second set codeword by at least two roots of the generator polynomial in parallel.

22. The method of correcting errors in digital data as recited in claim 14, wherein the step of generating the first error syndromes comprises the step of dividing data symbols of a first set codeword that intersect with a second set codeword by roots of a generator polynomial.

23. The method of correcting errors in digital data as recited in claim 14, wherein the step of concurrently generating the first error syndromes and the second error syndromes comprises the step of storing the second error syndromes for the second set codewords into a second syndrome buffer.

24. The method of correcting errors in digital data as recited in claim 23, wherein the step of concurrently generating the first error syndromes and the second error syndromes comprises the step of updating a second error syndrome stored in the second syndrome buffer using the symbols of the second set codeword that intersect with the symbols of a first set codeword.

25. The method of correcting errors in digital data as recited in claim 24, wherein:
   (a) the step of correcting the digital data stored in the data buffer comprises the step of generating an error correction value in response to a first syndrome for correcting a symbol in a first set codeword; and
   (b) the step of updating the a second error syndrome stored in the second syndrome buffer uses the error correction value.

26. The method of correcting errors in digital data as recited in claim 25, wherein before the step of updating the second error syndrome using the error correction value, adjusting the second error syndrome with respect to the location of the corrected symbol in the first set codeword.

27. An error correction processor for correcting errors in digital data recorded on a storage medium in the form of a multi-dimensional code comprising a first set of codewords that intersect with a second set of codewords, the error correction processor comprising:
   (a) a data buffer for storing the digital data read from the storage medium;
   (b) a first syndrome buffer for storing first error syndromes associated with the first set of codewords;
   (c) a second syndrome buffer for storing second error syndromes associated with the second set of codewords;
   (d) a syndrome generator for concurrently generating the first and second error syndromes using the digital data stored in the data buffer and the first error syndromes stored in the first syndrome buffer; and
   (e) an error corrector, responsive to the first and second error syndromes, for correcting the digital data stored in the data buffer.

28. The error correction processor as recited in claim 27, wherein the syndrome generator updates the first and second error syndromes using correction values generated by the error corrector.

29. The error correction processor as recited in claim 28, wherein the syndrome generator adjusts the first and second error syndromes according to a location of a corrected data symbol before using the correction values to update the first and second error syndromes.

30. The error correction processor as recited in claim 27, wherein a single silicon chip comprises the first and second syndrome buffers.

* * * * *